United States Patent
Kim et al.

(10) Patent No.: US 8,735,025 B2
(45) Date of Patent: May 27, 2014

(54) PHOTOSENSITIVE RESIN COMPOSITION FOR PRODUCING COLOR FILTER AND COLOR FILTER FOR IMAGE SENSOR PRODUCED USING THE COMPOSITION

(75) Inventors: Jae Hyun Kim, Seoul (KR); Kil Sung Lee, Gwacheon-si (KR); Eui June Jeong, Seoul (KR); Chang Min Lee, Goyang-si (KR); Sung Hyok Kim, Hwaseong-si (KR)

(73) Assignee: Cheil Industries Inc., Gumi-si (KR)

( * ) Notice: Subject to any disclaimer, the term of this patent is extended or adjusted under 35 U.S.C. 154(b) by 1192 days.

(21) Appl. No.: 11/965,134

(22) Filed: Dec. 27, 2007

(65) Prior Publication Data

US 2008/0171271 A1    Jul. 17, 2008

(30) Foreign Application Priority Data

Jan. 17, 2007    (KR) .................. 10-2007-0005042

(51) Int. Cl.
*G03F 1/00*    (2012.01)

(52) U.S. Cl.
USPC .................... 430/7; 430/270.1; 430/288.1

(58) Field of Classification Search
USPC ...................... 430/7, 270.1, 288.1
See application file for complete search history.

(56) References Cited

U.S. PATENT DOCUMENTS

| | | | |
|---|---|---|---|
| 5,278,009 A | 1/1994 | Iida et al. | |
| 5,663,019 A | 9/1997 | Matsumura et al. | |
| 5,998,091 A | 12/1999 | Suzuki | |
| 6,589,672 B1 | 7/2003 | Kobayashi et al. | |
| 6,826,001 B2 | 11/2004 | Funakura et al. | |
| 8,153,706 B2 | 4/2012 | Vasudevan | |
| 2002/0045112 A1* | 4/2002 | Kishimoto et al. | 430/7 |
| 2002/0172873 A1 | 11/2002 | Ueda et al. | |
| 2004/0157140 A1 | 8/2004 | Kamata et al. | |
| 2006/0051685 A1 | 3/2006 | Fujimori et al. | |
| 2006/0100298 A1 | 5/2006 | Ulrich et al. | |
| 2006/0257762 A1* | 11/2006 | Fujimori et al. | 430/7 |
| 2006/0275676 A1* | 12/2006 | Yamada | 430/7 |
| 2008/0160432 A1* | 7/2008 | Byon et al. | 430/7 |
| 2008/0286688 A1 | 11/2008 | Koyanagi et al. | |
| 2009/0029120 A1 | 1/2009 | Fujii et al. | |
| 2010/0104958 A1 | 4/2010 | Jeong et al. | |

FOREIGN PATENT DOCUMENTS

| | | |
|---|---|---|
| CN | 1188908 A | 7/1998 |
| CN | 1460192 A | 12/2003 |
| CN | 1782748 A | 6/2006 |
| EP | 0337951 A2 | 10/1989 |

(Continued)

OTHER PUBLICATIONS

Korean Office Action in commonly owned Korean Patent Application No. 10-2006-0136211, dated Jun. 18, 2009, pp. 1-4.

(Continued)

*Primary Examiner* — Stewart Fraser
(74) *Attorney, Agent, or Firm* — Additon, Higgins, Pendleton & Ashe, P.A.

(57) ABSTRACT

Provided is a photosensitive resin composition that is developable with an aqueous alkaline solution and is suitable for the production of a color filter for an image sensor. The composition comprises an alkali-soluble resin, a photopolymerizable monomer, a photopolymerization initiator, colorants and a solvent. As the colorants, a pigment and a dye are used in combination. The use of the composition enables the formation of fine pixels that exhibit excellent color reproduction and contrast. Therefore, the composition can be used to produce a high-resolution color filter for an image sensor.

20 Claims, 2 Drawing Sheets

(56) References Cited

FOREIGN PATENT DOCUMENTS

| | | |
|---|---|---|
| EP | 0628599 A1 | 7/1994 |
| EP | 0725315 A2 | 8/1996 |
| JP | 07-140654 | 6/1995 |
| JP | 7-172032 | 7/1995 |
| JP | 09-203806 | 8/1997 |
| JP | 10-254133 | 9/1998 |
| JP | 2000-309726 | 11/2000 |
| JP | 2002-309118 | 10/2002 |
| JP | 2003-003109 | 1/2003 |
| JP | 2003-161828 A | 6/2003 |
| JP | 2003-167113 A | 6/2003 |
| JP | 2004-341121 | 12/2004 |
| KR | 10-1991-0004717 B1 | 7/1991 |
| KR | 10-1992-7002502 | 9/1992 |
| KR | 10-1993-7000858 | 3/1993 |
| KR | 10-1994-0005617 B1 | 6/1994 |
| KR | 10-1994-0007778 | 8/1994 |
| KR | 10-1995-7000359 | 1/1995 |
| KR | 10-1995-0011163 B1 | 9/1995 |
| KR | 10-1995-7003746 | 9/1995 |
| KR | 10-1996-0029904 | 8/1996 |
| KR | 10-2004-0095670 A | 11/2004 |
| KR | 10-2005-0069024 A | 7/2005 |
| KR | 10-2005-0070619 A | 7/2005 |
| KR | 2006-0052171 | 5/2006 |
| KR | 10-2006-0077971 A | 7/2006 |
| KR | 10-2006-0096882 A | 9/2006 |
| KR | 10-2008-0036351 A | 4/2008 |
| WO | 2005/071489 A1 | 8/2005 |
| WO | WO 2006-377728 * | 4/2006 |

OTHER PUBLICATIONS

English translation of Korean Office Action in commonly owned Korean Patent Application No. 10-2006-0136211, dated Jun. 18, 2009, pp. 1-2.

Chinese Office Action in commonly owned Chinese Application No. 200710302350.3 dated Jul. 29, 2011, pp. 1-6.

English translation of Chinese Office Action in commonly owned Chinese Application No. 200710302350.3 dated Jul. 29, 2011, pp. 1-11.

Office Action in commonly owned U.S. Appl. No. 11/949,114 mailed Aug. 19, 2010, pp. 1-11.

Final Office Action in commonly owned U.S. Appl. No. 11/949,114 mailed Feb. 3, 2011, pp. 1-9.

Final Office Action in commonly owned U.S. Appl. No. 11/949,114 mailed May 16, 2011, pp. 1-9.

Advisory Action in commonly owned U.S. Appl. No. 11/949,114 mailed Aug. 22, 2011, pp. 1-3.

Office Action in commonly owned U.S. Appl. No. 12/582,005 mailed Apr. 25, 2012, pp. 1-7.

* cited by examiner

PHOTOSENSITIVE RESIN COMPOSITION FOR PRODUCING COLOR FILTER AND COLOR FILTER FOR IMAGE SENSOR PRODUCED USING THE COMPOSITION

CROSS-REFERENCE TO RELATED APPLICATION

This non-provisional application claims priority under 35 USC Section 119 from Korean Patent Application No. 10-2007-0005042, filed on Jan. 17, 2007, which is hereby incorporated by reference in its entirety.

FIELD OF THE INVENTION

The present invention relates to a photosensitive resin composition that is developable with an aqueous alkaline solution and is suitable for the production of a color filter for an image sensor.

BACKGROUND OF THE INVENTION

Image sensors are devices that consist of several million photovoltaic devices. Image sensors convert light to electrical signals corresponding to the intensity of the light. Such image sensors are used to enable digital input devices to record images prior to digitization into digital images. With recent rapid developments in technologies, there has been an exponentially increased demand for image sensors for use in various security systems and digital cameras.

Image sensors comprise an array of pixels, that is, a plurality of pixels arrayed in a two-dimensional matrix form, each of which includes a photodetector and transmission/signal output devices. Image sensors are broadly classified into two types, i.e. charge coupled device (CCD) image sensors and complementary metal oxide semiconductor (CMOS) image sensors, depending on transmission/signal output devices employed in the image sensors.

The structure of a CMOS image sensor is schematically shown in FIG. 1. A color filter of the image sensor functions to separate incident light into red (R), green (G) and blue (B) light components and transmit the separated components to corresponding photodiodes of each pixel.

Research and development have been focused on photosensitive resin compositions, which are compatible with aqueous alkaline developer, for producing color filters only for liquid crystal displays, not for image sensors.

A recent approach to achieve improved image quality of image processing devices, particularly, digital cameras, is to decrease the length of one side of pixels from 3-5 μm down to 1 μm. These conditions require significantly improved pixel materials.

Among patent publications disclosing compositions for producing color filters for image sensors, Korean Patent Publication No. 2006-0052171 and Japanese Patent Publication No. 2004-341121 are directed to methods for forming a fine pattern of about 2.0 μm×2.0 μm. These methods are characterized by the use of dyes as colorants, instead of pigments, to form high-density pixels. However, the fine pixels formed by the compositions suffer from poor long-term reliability since the dyes are highly susceptible to light and heat. (The data show the reliability for one hour to 20 hours maximum.) Japanese Patent Publication No. Hei 7-172032 is directed to a method for the formation of fine R, G and B pixels using a black matrix to prevent color mixing between the pixels and dislocation of the pixels. However, the process requires an additional step to form the black matrix, and it is substantially impossible to elaborately form the black matrix. Further, the black matrix results in a low opening ratio.

At present, there is an increasing need for compositions with excellent color characteristics to fabricate image sensors that have high-quality images with high color reproducibility and contrast ratio. More specifically, it is required to lower the transmittance at a cross point where transmittance curves of green and blue light meet to 40% or less, and at the same time, to minimize the transmittance values of RGB compositions in the respective wavelength regions (cross talks), i.e. the transmittance of a red composition in a wavelength range of 400-550 nm, the transmittance of a green composition in wavelength ranges of 400-460 nm and 620-700 nm and the transmittance of a blue composition in a wavelength range of 520-700 nm.

SUMMARY OF THE INVENTION

In accordance with one aspect of the present invention, there is provided a photosensitive resin composition useful for producing a color filter, the composition comprising an alkali-soluble resin, a photopolymerizable monomer, a photopolymerization initiator, colorants and a solvent, wherein a pigment and a dye are used as the colorants. The photosensitive resin composition of the invention can be used to form ultra-fine pixels that exhibit high color reproducibility and contrast ratio. In addition, the pigment and dye can be highly resistant to heat and light and the composition can be used to form a pattern of ultra-fine square pixels of up to 1.0 μm², for example of 1.7 μm², without leaving any residue on unexposed areas.

The photosensitive resin composition of the present invention can comprise (1) about 0.5 to about 30% by weight of the alkali-soluble resin, (2) about 0.5 to about 30% by weight of the photopolymerizable monomer, (3) about 0.1 to about 10% by weight of the photopolymerization initiator, (4) about 0.1 to about 40% by weight of the pigment, (5) about 0.1 to about 20% by weight of the dye, and (6) the balance of the solvent.

The dye can include at least one compound selected from compounds represented by Formulae 1, 2, 3 and 4:

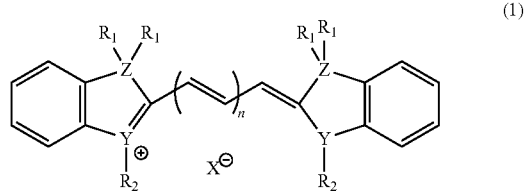

(1)

wherein each $R_1$ is independently H or $CH_3$, each $R_2$ is independently a $C_1$-$C_{10}$ alkyl group, each Y is independently N, O or S, each Z is independently N, O, S or C, n is from 1 to 3, and X is a halogen, $ClO_4$, $PF_6$, $SbF_6$, $BF_4$ or

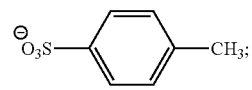

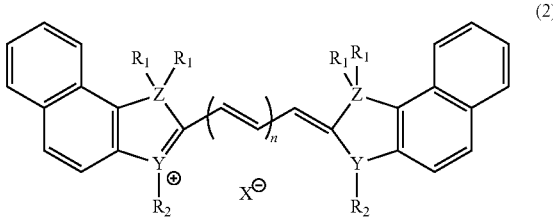

(2)

wherein $R_1$, $R_2$, Y, Z, n and X are as defined in Formula 1;

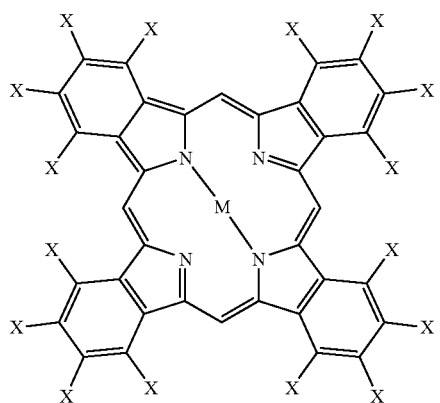

(3)

wherein M is Cu, Zn, V=O, Fe, Ni, Co, In—Cl, In-alkyl or In-alkoxy, and each X is independently H, F, Cl, Br or I; and

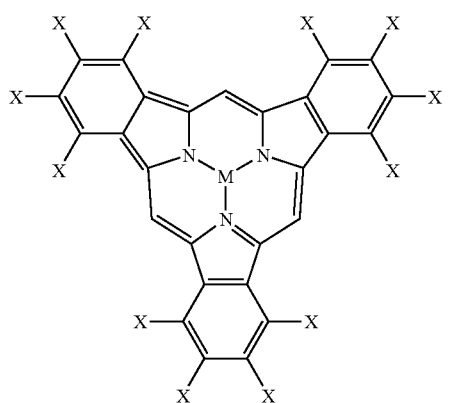

(4)

wherein M and X are as defined in Formula 3.

In accordance with another aspect of the present invention, there is provided a color filter for an image sensor which comprises a pattern formed using the photosensitive resin composition.

DETAILED DESCRIPTION OF THE INVENTION

Figure 1:
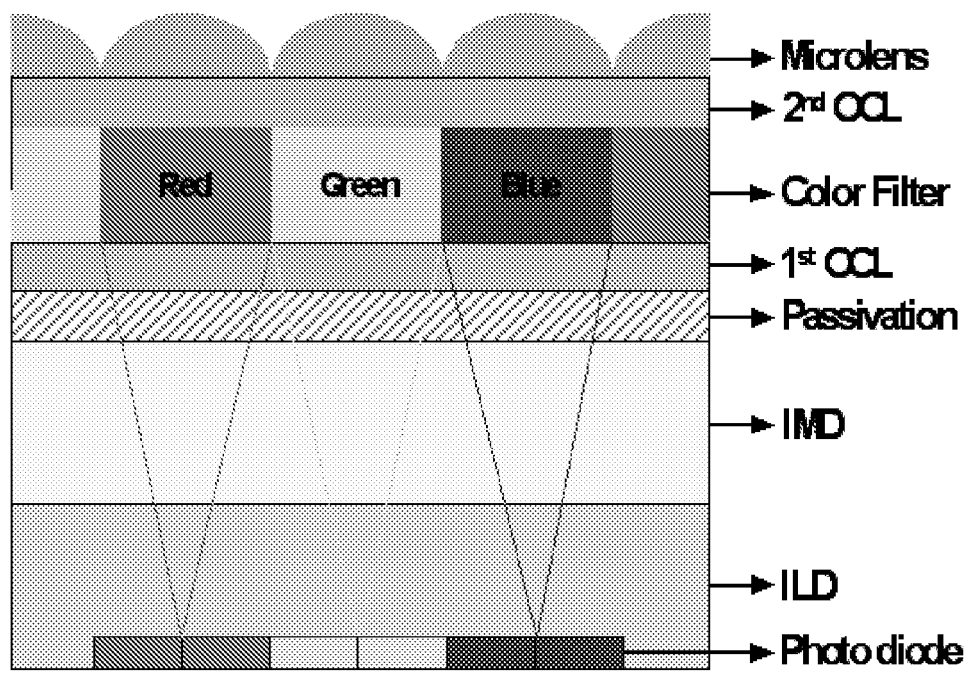
FIG. 1 is a schematic cross-sectional view of a CMOS image sensor.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The alkali-soluble resin used in the present invention is a carboxyl group-containing acrylic binder resin. Specifically, the carboxyl group-containing acrylic binder resin is a copolymer of ethylenically unsaturated monomers having one or more carboxyl groups and other ethylenically unsaturated monomers copolymerizable therewith.

The content of the ethylenically unsaturated monomers having one or more carboxyl groups in the carboxyl group-containing acrylic binder resin is in the range of about 10% to about 40% by weight, for example about 20 to 30% by weight.

The ethylenically unsaturated monomer having one or more carboxyl groups may be acrylic acid, methacrylic acid, maleic acid, itaconic acid, fumaric acid, or a mixture thereof.

Examples of ethylenically unsaturated monomers that are copolymerizable with the ethylenically unsaturated monomer having one or more carboxyl groups include without limitation: styrene compounds such as styrene, α-methylstyrene, vinyltoluene and vinylbenzyl methyl ether; unsaturated carboxylic acid esters such as methyl acrylate, methyl methacrylate, ethyl acrylate, ethyl methacrylate, butyl acrylate, butyl methacrylate, 2-hydroxyethyl acrylate, 2-hydroxyethyl methacrylate, 2-hydroxybutyl acrylate, 2-hydroxybutyl methacrylate, benzyl acrylate, benzyl methacrylate, cyclohexyl acrylate, cyclohexyl methacrylate, phenyl acrylate and phenyl methacrylate; unsaturated carboxylic acid aminoalkyl esters such as 2-aminoethyl acrylate, 2-aminoethyl methacrylate, 2-dimethylaminoethyl acrylate and 2-dimethylaminoethyl methacrylate; carboxylic acid vinyl esters such as vinyl acetate and vinyl benzoate; unsaturated carboxylic acid glycidyl esters such as glycidyl acrylate and glycidyl methacrylate; vinyl cyanide compounds such as acrylonitrile and methacrylonitrile; unsaturated amides such as acrylamide and methacrylamide. One or more monomers selected from the above-mentioned ethylenically unsaturated monomers may be included in the carboxyl group-containing acrylic binder resin.

The carboxyl acid-containing acrylic binder resin can have a molecular weight ($M_w$) of about 10,000 to about 70,000, for example about 20,000 to about 50,000.

Examples of carboxyl group-containing acrylic binder resins include without limitation methacrylic acid/methyl methacrylate copolymers, methacrylic acid/benzyl methacrylate copolymers, methacrylic acid/benzyl methacrylate/styrene copolymers, methacrylic acid/benzyl methacrylate/2-hydroxyethyl methacrylate copolymers, and methacrylic acid/benzyl methacrylate/styrene/2-hydroxyethyl methacrylate copolymers.

The composition can include the carboxyl group-containing acrylic binder resin in an amount between about 0.5% and about 30% by weight, based on the total weight of the composition. When the carboxyl group-containing acrylic binder resin is present in the composition in an amount of less than about 0.5% by weight, the composition may not be developed with an alkaline developing solution. Meanwhile, when the carboxyl group-containing acrylic binder resin is present in the composition an amount exceeding about 30% by weight, the composition is less cross-linked, and the surface turns rough.

The carboxyl group-containing acrylic binder resin is typically the most important factor in determining the resolution of pixels formed using the composition. For example, when a methacrylic acid/benzyl methacrylate copolymer is used as the carboxyl group-containing acrylic binder resin, the resolution of pixels formed using the composition is very dependent on the acid value and molecular weight of the copolymer. Experimental results have revealed that the best resolution results could be attained when the molar ratio of methacrylic acid to benzyl methacrylate in the copolymer was about 25:75, the acid value of the copolymer was about 80 to about 120 and the molecular weight of the copolymer was about 20,000 to about 40,000.

A conventional acrylic photopolymerizable monomer may be used in the present invention. Examples of photopolymerizable monomers suitable for use in the present invention can include without limitation ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenol A diacrylate, trimethylolpropane triacrylate, novolac epoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, and the like, and mixtures thereof.

The composition can include the acrylic photopolymerizable monomer in an amount of about 0.5 to about 30% by weight, based on the total weight of the composition. When the content of the acrylic photopolymerizable monomer is less than about 0.5% by weight, edges of pixels formed using the composition may be irregular. Meanwhile, when the content of the acrylic photopolymerizable monomer is greater than about 30% by weight, the composition may not be developed with an alkaline developing solution.

A conventional photopolymerization initiator may be used in the present invention. Examples of photopolymerization initiators suitable for use in the present invention can include without limitation a triazine compound, an acetophenone compound, a benzophenone compound, a thioxanthone compound, a benzoin compound, and the like, and mixtures thereof.

The composition can include the photopolymerization initiator in an amount of about 0.1% to about 10% by weight, based on the total weight of the composition. The use of the photopolymerization initiator in an amount of less than about 0.1% by weight causes insufficient photopolymerization upon light exposure for pattern formation. If, however, the photopolymerization initiator is used in an amount exceeding about 10% by weight, unreacted initiators may remain in the composition after photopolymerization and deteriorate transmittance.

Examples of triazine compounds suitable for use in the invention include without limitation 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-styryl)-4,6-bis(trichloromethyl)-s-triazine, 2-p-phenyl-4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2-4-trichloromethyl(piperonyl)-6-triazine, 2-4-trichloromethyl(4'-methoxystyryl)-6-triazine, and the like, and mixtures thereof.

Examples of acetophenone compounds suitable for use in the invention can include without limitation 2,2'-diethoxyacetophenone, 2,2'-dibutoxyacetophenone, 2-hydroxy-2-methylpropiophenone, p-t-butyltrichloroacetophenone, p-t-butyldichloroacetophenone, benzophenone, 4-chloroacetophenone, 4,4'-dimethylaminobenzophenone, 4,4'-dichlorobenzophenone, 3,3'-dimethyl-2-methoxybenzophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, and mixtures thereof.

Examples of benzophenone compounds suitable for use in the invention can include without limitation benzophenone, benzoylbenzoate, methyl benzoylbenzoate, 4-phenylbenzophenone, hydroxybenzophenone, acrylated benzophenone, 4,4'-bis(dimethylamino)benzophenone, 4,4'-bis(diethylamino)benzophenone, and the like, and mixtures thereof.

Examples of thioxanthone compounds suitable for use in the invention include without limitation thioxanthone, 2-chlorothioxanthone, 2-methylthioxanthone, isopropylthioxanthone, 2,4-diethylthioxanthone, 2,4-diisopropylthioxanthone, 2-chlorothioxanthone, and the like, and mixtures thereof.

Examples of benzoin compounds suitable for use in the invention can include without limitation benzoin, benzoin methyl ether, benzoin ethyl ether, benzoin isopropyl ether, benzoin isobutyl ether, benzyl dimethyl ketal, and the like, and mixtures thereof.

Other compounds may also be used as the photopolymerization initiator, such as but not limited to carbazole compounds, diketone compounds, sulfonium borate compounds, diazo compounds, biimidazole compounds, and the like, and mixtures thereof.

Triazine compounds can be particularly useful for the formation of a pattern of ultra-fine square pixels without leaving any residue on unexposed areas. Further, the inventors have found that triazine compounds having maximum absorption in wavelength ($\lambda_{max}$) of about 340 to about 380 nm most affected the performance of pixel patterns. The present invention has been achieved based on this finding.

Triazine compounds that can be particularly useful in the present invention are represented by Formulae 5, 6, 7 and 8:

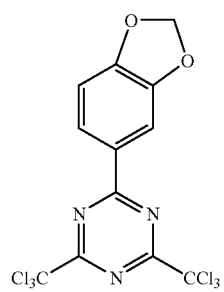

(5)

(6)

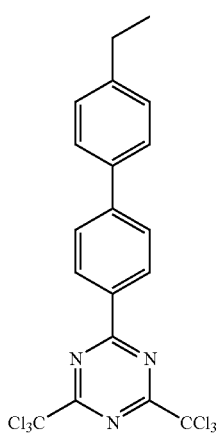

(7)

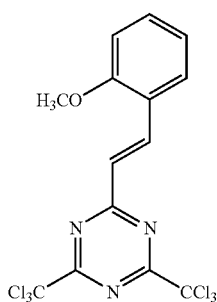

(8)

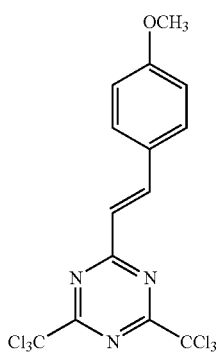

Examples of pigments suitable for use in the present invention include without limitation red, green, blue, yellow and violet pigments. Examples of these pigments include anthraquinone pigments, condensed polycyclic pigments (e.g., perylene pigments), phthalocyanine pigments, and azo pigments, which may be used alone or as a mixture thereof. The use of a mixture of two or more pigments can be useful for adjusting the maximum absorption wavelength, cross point, cross talk and other conditions.

The pigment may be, for example, selected from zinc phthalocyanine, Pigment Blue 60 and Pigment Blue 80 represented by Formulae 9, 10 and 11, respectively:

(9)

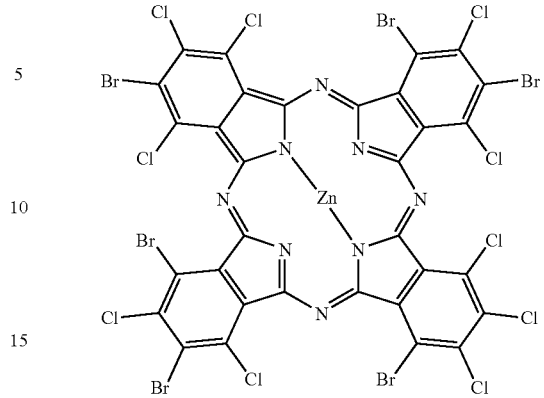

(10)

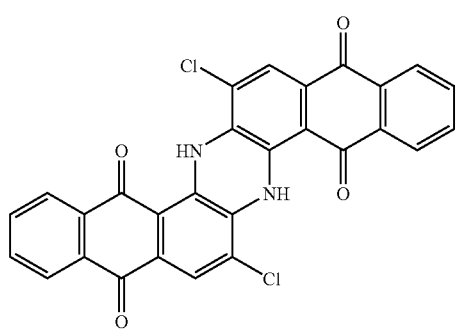

(11)

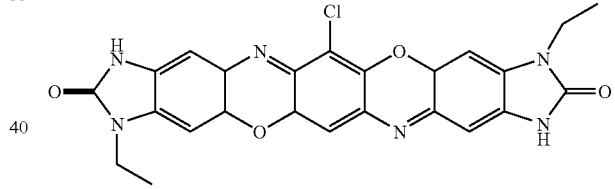

By the use of the compound of Formula 9, 10 or 11 as the pigment, the maximum transmittance ($T_{max}$) and cross talk of the composition can be easily adjusted.

The pigment used in the present invention can have has a primary particle diameter of about 10 to about 70 nm. The use of the pigment having a primary particle diameter smaller than about 10 nm may make a dispersion containing the pigment unstable, while the use of the pigment having a primary particle diameter larger than about 70 nm may unfavorably cause the resolution of pixels formed using the composition to deteriorate.

It is preferred to previously disperse the pigment before the pigment is incorporated into the composition. In this case, the secondary particle diameter of the pigment is not particularly limited and can be, for example, smaller than about 200 nm in view of the resolution of pixels formed using the composition.

If needed, the pigment dispersion may further comprise a dispersant to disperse the pigment homogeneously. The dispersant may be any of non-ionic, anionic and cationic dispersants. Examples of such dispersants include without limitation polyalkylene glycols and esters thereof, polyoxyalkylene, polyhydric alcohol esters, alkylene oxide adducts, alcohol alkylene oxide adducts, sulfonic acid esters, sulfonic acid salts, carboxylic acid esters, carboxylic acid salts, alkyl amide alkylene oxide adducts, alkyl amines, and the like. These dispersants may be used alone or in combination of two or more thereof. Exemplary dispersants that may be used in the present invention are described in commonly owned Korean Patent Application 10-2007-0001200, filed Jan. 5, 2007, and its U.S. counterpart Ser. No. 11/965,353, filed Dec. 27, 2007, the entire disclosures of both of which are hereby incorporated by reference.

In addition or as an alternative to the dispersants noted herein, the same compound as the alkali-soluble resin used in the present invention may be used as the dispersant to improve the stability of the pigment dispersion and the patternability of pixels formed using the composition.

The composition can include the pigment in an amount of about 0.1 to about 40% by weight, based on the total weight of the composition. The use of the pigment in an amount less than about 0.1% by weight has little coloration effect. Meanwhile, the use of the pigment in an amount exceeding about 40% by weight can cause a drastic deterioration in the developability of the composition.

Examples of dyes suitable for use in the present composition include without limitation pyrazole azo, anilino azo, triphenylmethane, anthraquinone, anthrapyridone, benzylidene, oxonol, pyrazole-triazine, pyridone azo, cyanine, phenothiazine, pyrrolotriazole azomethine, xanthene, phthalocyanine, benzopyranindigo dyes, and the like and mixtures thereof. Exemplary compositions of the invention can include at least one compound selected from the compounds of Formulae 1, 2, 3 and 4:

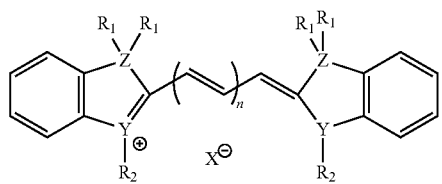
(1)

wherein each $R_1$ is independently H or $CH_3$, each $R_2$ is independently a $C_1$-$C_{10}$ alkyl group, each Y is independently N, O or S, each Z is independently N, O, S or C, n is from 1 to 3, and X is a halogen, $ClO_4$, $PF_6$, $SbF_6$, $BF_4$ or

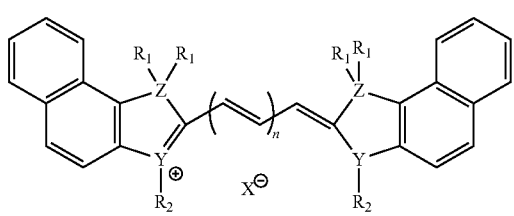
(2)

wherein $R_1$, $R_2$, Y, Z, n and X are as defined in Formula 1;

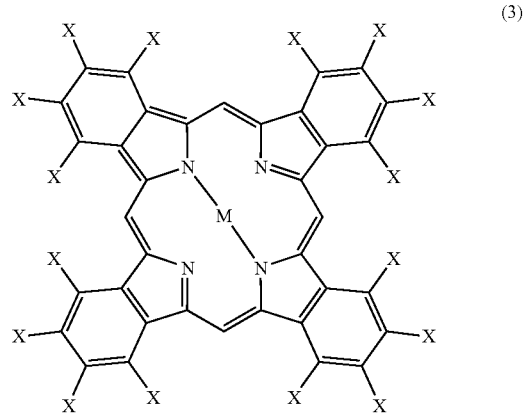
(3)

wherein M is Cu, Zn, V=O, Fe, Ni, Co, In—Cl, In-alkyl or In-alkoxy, and each X is independently H, F, Cl, Br or I; and

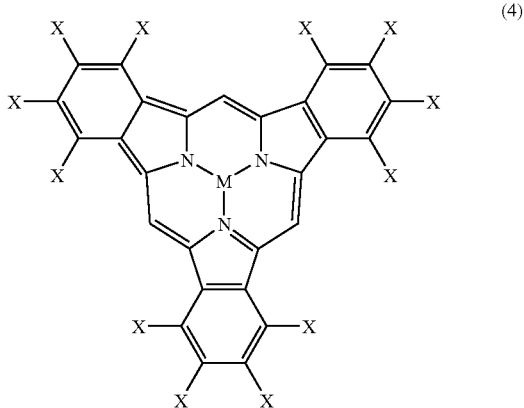
(4)

wherein M and X are as defined in Formula 3.

The composition can include the dye in an amount of about 0.1 to about 20% by weight, based on the total weight of the composition. The use of the dye in an amount smaller than about 0.1% by weight may deteriorate color reproducibility and contrast ratio of a pattern formed using the composition. Meanwhile, the use of the dye in an amount larger than about 20% by weight can result in poor light and heat resistance of a pattern formed using the composition.

Examples of solvents suitable for use in the present invention include ethylene glycol acetate, ethyl cellosolve, propylene glycol methyl ether acetate, ethyl lactate, polyethylene glycol, cyclohexanone, propylene glycol methyl ether, ethyl 3-ethoxypropionate, and the like. These solvents may be used alone or as a mixture of two or more thereof.

The composition can include the solvent in an amount of about 20 to about 90% by weight, based on the total weight of the composition.

If needed, at least one additive selected from malonic acid, 3-amino-1,2-propanediol and fluorinated surfactants may be further added to the composition to prevent the formation of defects and stains in a coating process, to control a leveling process and to obviate residue due to incomplete development of the composition.

The photosensitive resin composition of the present invention is applied to a wafer for a color filter of an image sensor in a thickness of about 0.5 to about 1 μm. The application is performed by any appropriate coating technique, e.g., spin coating or slit coating.

Then, the coated wafer is irradiated with light to form a pattern necessary to produce a color filter for an image sensor. I-line of 356 nm is used as a light source for the irradiation. The coating layer is developed with an alkaline developing solution to dissolve unexposed portions of the coating layer, thus forming a pattern necessary to produce a color filter for an image sensor. This procedure is repeatedly carried out depending on the number of R, G and B colors to produce a color filter having a desired pattern. At this time, the pattern formed after the development may be additionally heated or cured by irradiation with actinic rays to further improve the physical properties such as crack resistance and solvent resistance of the color filter.

Hereinafter, the present invention will be explained in more detail with reference to the following examples. However, these examples are given for the purpose of illustration only and are not to be construed as limiting the scope of the invention.

EXAMPLES

Example 1

| | |
|---|---|
| (1) Alkali-soluble resin | 5 g |
| (A')/(B') = 25/75 (w/w), Molecular weight ($M_w$) = 25,000 | |
| (A'): Methacrylic acid | |
| (B'): Benzyl methacrylate | |
| (2) Photopolymerizable monomer | |
| Dipentaerythritol hexaacrylate (DPHA) | 4.1 g |
| (3) Photopolymerization initiator | |
| TPP (Ciba Specialty) | 0.2 g |
| (4) Pigment dispersion | 46.8 g |
| Red (BT-CF, Ciba Specialty) | 6.2 g |
| Yellow (2RP-CF, Ciba Specialty) | 2.8 g |
| Dispersant | 2.4 g |
| Dispersion of the same alkali-soluble resin as (1) | 5.4 g |
| (5) Dye | |
| NIR680C (KISCO) | 0.6 g |
| (6) Solvents | |
| Propylene glycol monomethyl ether acetate | 19.4 g |
| Ethyl 3-ethoxypropionate | 23.8 g |
| (7) Additive | |
| Fluorinated surfactant (F-475) | 0.1 g |

A photosensitive resin composition is prepared using the above components in accordance with the following procedure:

(1) Dissolve the photopolymerization initiator in the solvents and stir the solution at room temperature for 2 hours;
(2) Add the carboxyl group-containing acrylic binder resin and the photopolymerizable monomer to the solution prepared in (1), followed by stirring at room temperature for 2 hours;
(3) Add the pigment dispersion to the mixture obtained in (2), followed by stirring at room temperature for one hour;
(4) Add the surfactant to the mixture obtained in (3), followed by stirring at room temperature for one hour; and
(5) Filter the mixture obtained in (4) three times to remove impurities present therein.

Figure 2:
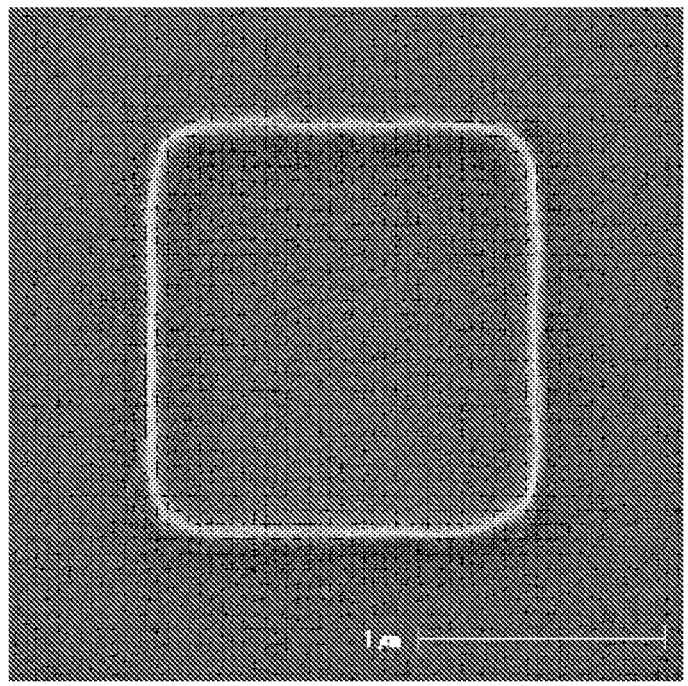
FIG. 2 is a top view of a scanning electron micrograph (SEM) of a pixel pattern formed using a composition prepared in Example 1.

The composition thus prepared is coated on a 6"-wafer as a substrate using a spin coater (1H-DX2, Mikasa) and dried at 100° C. for 180 seconds. The coated wafer is exposed to light using an i-line stepper (NSR i10C, Nikon, Japan) equipped with a reticle, in which patterns having various sizes were provided, for 250 ms, and developed with a 2.38% TMAH solution at room temperature for 120 seconds. The developed structure is cleaned and dried on a plate at a high temperature of 200° C. for 300 seconds to form a pattern. The pattern is observed under a scanning electron microscope (SEM) to determine the resolution of the pattern. A cross section of the pattern is observed by scanning electron microscopy (SEM) and is shown in FIG. 2. The coating thickness is measured using ST4000-DLX (KMAC). The cross section of the pixel pattern (1 μm×1 μm) is observed to be a profile close to a square. Other evaluation results are summarized in Table 1.

Examples 2-10

The procedure of Example 1 is repeated, except that the kinds of the dye and the pigments are varied as shown in Table 1. The results are summarized in Table 1.

Comparative Examples 1 to 3

Figure 3:
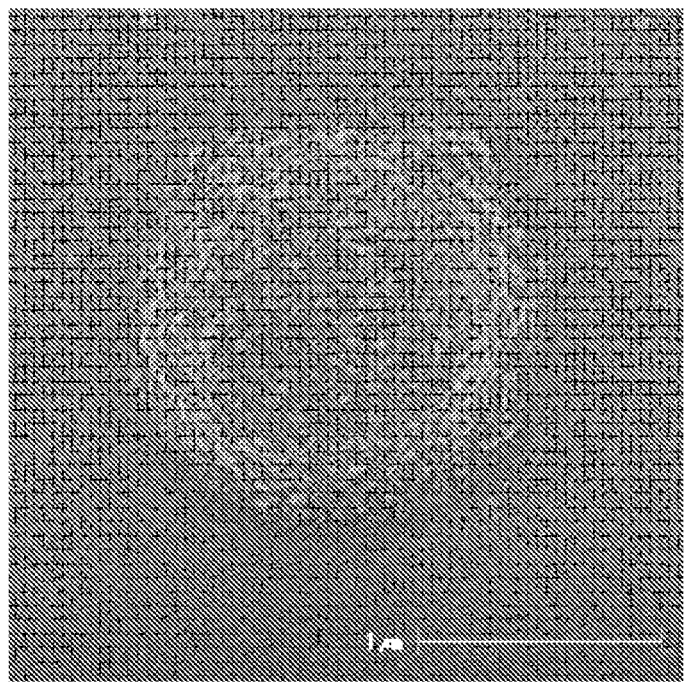
FIG. 3 is a top view of a scanning electron micrograph (SEM) of a pixel pattern formed using a composition prepared in Comparative Example 1.

Patterns are formed in the same manner as in Example 1, except that red pigments only (Comparative Example 1), green pigments only (Comparative Example 2) and blue pigments only (Comparative Example 3) are used without the use of any dye. Cross sections of the patterns are taken by scanning electron microscopy (SEM). The cross section of the pattern formed in Comparative Example 1 is shown in FIG. 3. The cross section of the pixel pattern (1 μm×1 μm) is observed to be substantially circular. Other evaluation results are summarized in Table 1

TABLE 1

| | | | Pixel pattern | | |
|---|---|---|---|---|---|
| | Dye (Trade name) | Pigments | Profile*[1] | Residue*[2] | Resolution (μm)* |
| Example 1 | NIR680C (KISCO) | Red (R254, Y139) | ○ | ○ | 1 × 1 |
| Example 2 | ADS680BP (ADS) | Red (R254, Y139) | ○ | Δ | 1 × 1 |
| Example 3 | GPX-201 (ADEKA) | Red (R254, Y139) | ○ | Δ | 1.2 × 1.2 |
| Example 4 | NIR680C (KISCO) | Green (G36, Y139) | ○ | ○ | 1.4 × 1.4 |
| Example 5 | ADS680BP (ADS) | Green (G36, Y139) | ○ | ○ | 1 × 1 |
| Example 6 | GPX-201 (ADEKA) | Green (G36, G7, Y139) | ○ | ○ | 1 × 1 |
| Example 7 | NK-9151 (Hayashibara) | Green (G36, G7, Y139) | ○ | ○ | 1 × 1 |
| Example 8 | NIR680C (KISCO) | Blue (B15:6, V23) | ○ | ○ | 1 × 1 |
| Example 9 | NK-9151 (Hayashibara) | Blue (B15:6, V23) | ○ | ○ | 1 × 1 |
| Example 10 | GPX-201 (ADEKA) | Blue (B15:6, V23) | ○ | ○ | 1.2 × 1.2 |
| Comparative Example 1 | — | Red (R254, Y139) | X | Δ | 5 × 5 |

TABLE 1-continued

|  | Dye (Trade name) | Pigments | Pixel pattern | | |
|---|---|---|---|---|---|
|  |  |  | Profile*[1] | Residue*[2] | Resolution (μm)* |
| Comparative Example 2 | — | Green (G36, Y139) | X | Δ | 5 × 5 |
| Comparative Example 3 | — | Blue (B15:6, V23) | Δ | Δ | 3 × 3 |

Note:
*Resolution represents the smallest pixel size discernable
*[1]Evaluation of profiles
The cross sections of the pixel patterns (1 μm × 1 μm), which are formed using appropriate exposure doses, are observed by scanning electron microscopy (SEM). The pattern profiles are evaluated based on the following criteria:
○ - Profile close to a square
Δ - Slightly round profile
X - Substantially circular profile
*[2]Residue
The cross sections of the pixel patterns (1 μm × 1 μm), which are formed using appropriate exposure doses, are observed by SEM. The patterns are evaluated based on the following criteria:
○ - No residue was left on unexposed areas
Δ - Residue was slightly left on unexposed areas
X - Residue was obviously observed on unexposed areas The results of Table 1 indicate that the patterns formed EXamples 1 to 10 show excellent characteristics in terms of profile, the existence of residue and resolution, compared to those prepared in Comparative Examples 1-3.

As apparent from the above description, the use of the photosensitive resin composition according to the present invention enables the formation of a pattern of ultra-fine pixels, for example a pattern of pixels 1×1 μm to 1.7×1.7 μm. Therefore, the photosensitive resin composition of the present invention can be effectively used to produce a high-resolution color filter for an image sensor.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for producing a color filter, the composition comprising an alkali-soluble resin, a photopolymerizable monomer, a photopolymerization initiator, 6.2 to about 40% by weight of a pigment and about 0.1 to about 20% by weight of a dye as colorants, and a solvent, wherein the dye includes at least one compound selected from compounds represented by Formulae 1, 2, and 3:

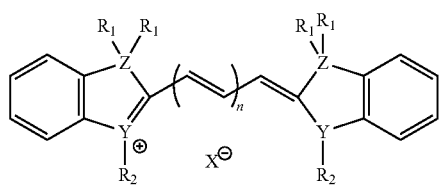

(1)

wherein each $R_1$ is independently H or $CH_3$, each $R_2$ is independently a C1-C10 alkyl group, each Y is independently N, O or S, each Z is independently N, O, S or C, n is from 1 to 3, and X is a halogen, $ClO_4$, $PF_6$, $SbF_6$, $BF_4$ or

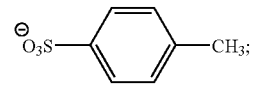

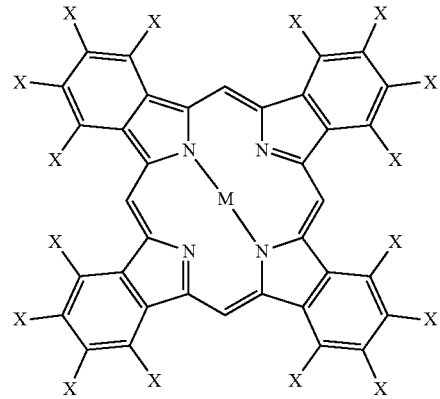

(2)

wherein M is Cu, Zn, V=O, Fe, Ni, Co, In—Cl, In-alkyl or In-alkoxy, and each X is independently H, F, Cl, Br or I; and

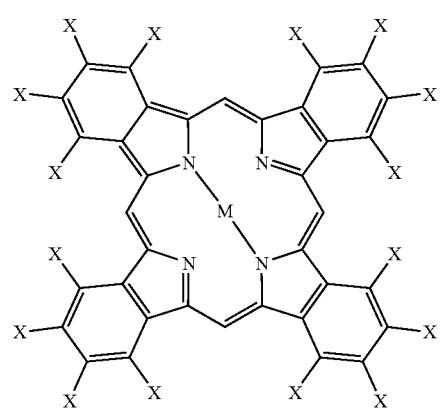

(3)

wherein M and X are as defined in Formula 2.

2. The photosensitive resin composition according to claim 1, wherein the composition comprises (1) about 0.5 to about 30% by weight of the alkali-soluble resin, (2) about 0.5 to about 30% by weight of the photopolymerizable monomer, (3) about 0.1 to about 10% by weight of the photopolymerization initiator, (4) 6.2 to about 40% by weight of the pigment, (5) about 0.1 to about 20% by weight of the dye, and (6) the balance of the solvent.

3. The photosensitive resin composition according to claim 1, wherein the pigment is selected from compounds represented by Formulae 9, 10 and 11:

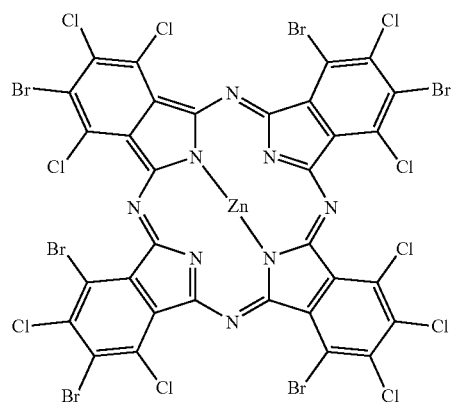
(9)

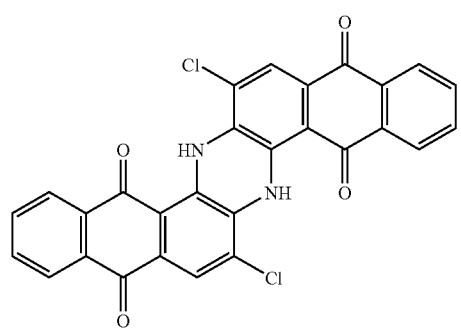
(10)

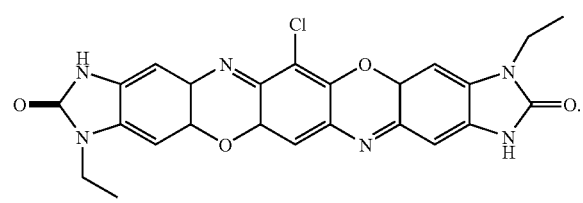
(11)

4. The photosensitive resin composition according to claim 1, wherein the photopolymerization initiator is a triazine compound.

5. The photosensitive resin composition according to claim 4, wherein the triazine compound has a maximum absorption in wavelength (λmax) of between 340 nm and 380 nm.

6. The photosensitive resin composition according to claim 1, further comprising at least one additive selected from malonic acid, 3-amino-1, 2-propanediol and fluorinated surfactants.

7. The photosensitive resin composition according to claim 1, wherein said alkali-soluble resin comprises methacrylic acid/benzyl methacrylate copolymer comprising a molar ratio of methacrylic acid to benzyl methacrylate in the copolymer of about 25:75 and having an acid value of about 80 to about 120 and a molecular weight of about 20,000 to about 40,000.

8. A color filter for an image sensor comprising a pattern formed using the photosensitive resin composition comprising an alkali-soluble resin, a photopolymerizable monomer, a photopolymerization initiator, 6.2 to about 40% by weight of a pigment and about 0.1 to about 20% by weight of a dye as colorants, and a solvent, wherein the dye includes at least one compound selected from compounds represented by Formulae 1, 2, and 3:

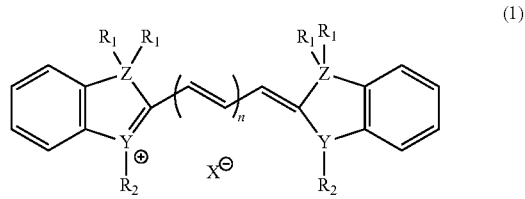
(1)

wherein each $R_1$ is independently H or $CH_3$, each $R_2$ is independently a C1-C10 alkyl group, each Y is independently N, O or S, each Z is independently N, O, S or C, n is from 1 to 3, and X is a halogen, $ClO_4$, $PF_6$, $SbF_6$, $BF_4$ or

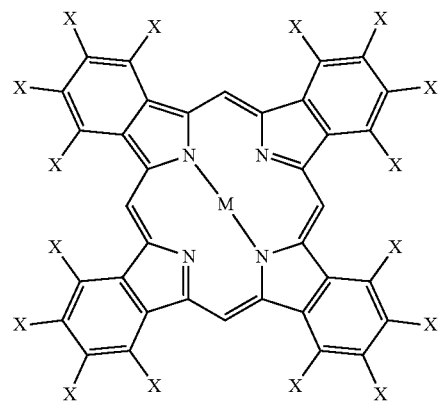
(2)

wherein M is Cu, Zn, V=O, Fe, Ni, Co, In—Cl, In-alkyl or In-alkoxy, and each X is independently H, F, Cl, Br or I; and

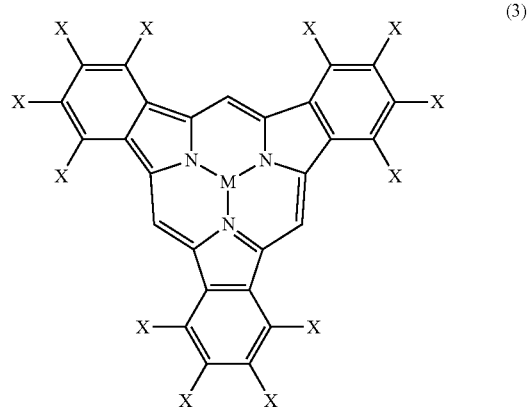
(3)

wherein M and X are as defined in Formula 2.

9. The color filter according to claim 8, wherein the pigment is selected from compounds represented by Formulae 9, 10 and 11:

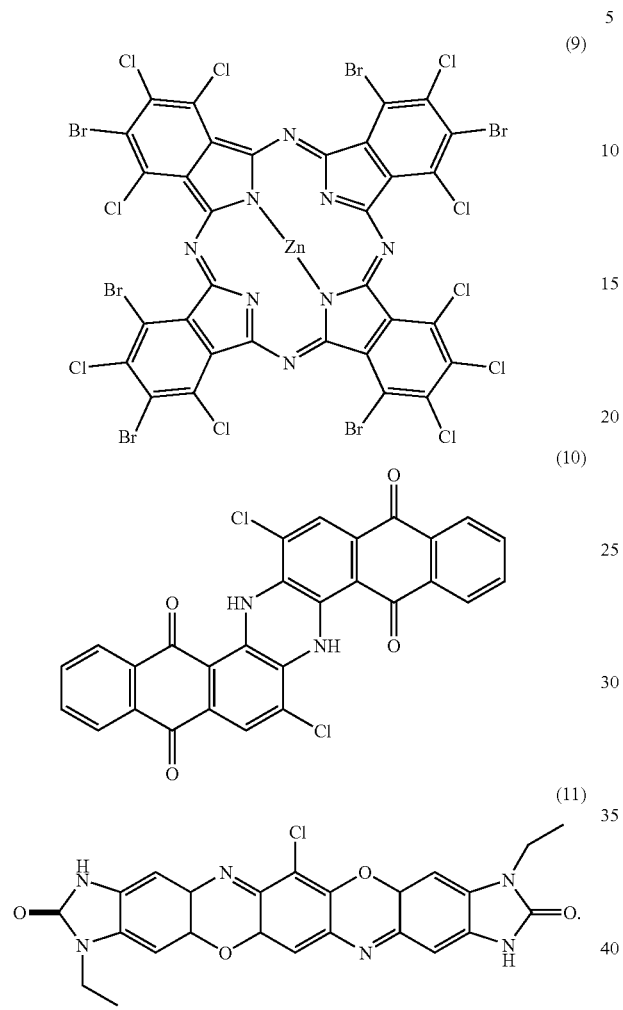

10. A coated substrate useful in a color filter for an image sensor, comprising:
   a substrate; and
   a pattern of substantially square pixels having a size of about 1×1 μm to 1.7×1.7 μm comprising a photopolymerized resin comprising 6.2 to about 40% by weight of a pigment and about 0.1 to about 20% by weight of a dye as colorants on a surface of said substrate, wherein the dye includes at least one compound selected from compounds represented by Formulae 1, 2, and 3:

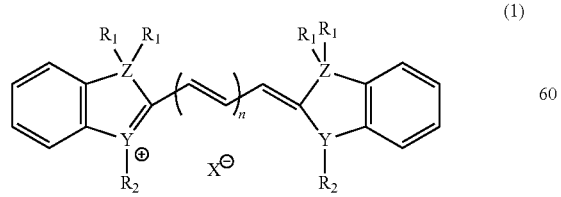

wherein each $R_1$ is independently H or $CH_3$, each $R_2$ is independently a C1-C10 alkyl group, each Y is independently N, O or S, each Z is independently N, O, S or C, n is from 1 to 3, and X is a halogen, $ClO_4$, $PF_6$, $SbF_6$, $BF_4$ or

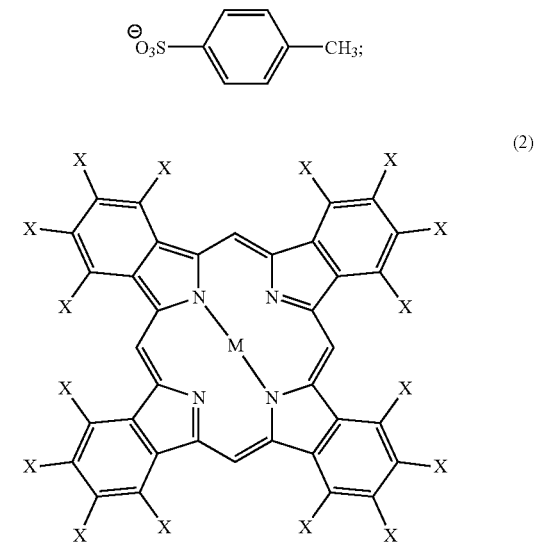

wherein M is Cu, Zn, V=O, Fe, Ni, Co, In—Cl, In-alkyl or In-alkoxy, and each X is independently H, F, Cl, Br or I; and

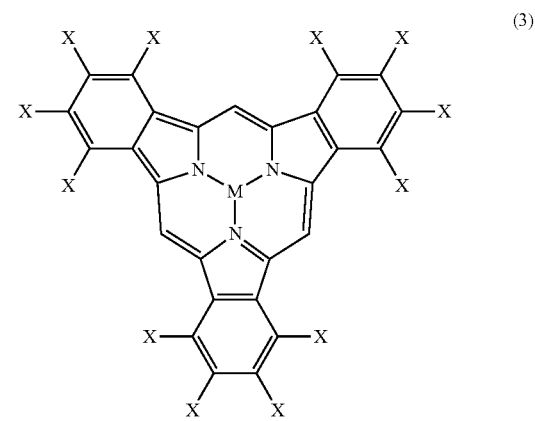

wherein M and X are as defined in Formula 2.

11. The coated substrate according to claim 10, wherein the pigment is selected from compounds represented by Formulae 9, 10 and 11:

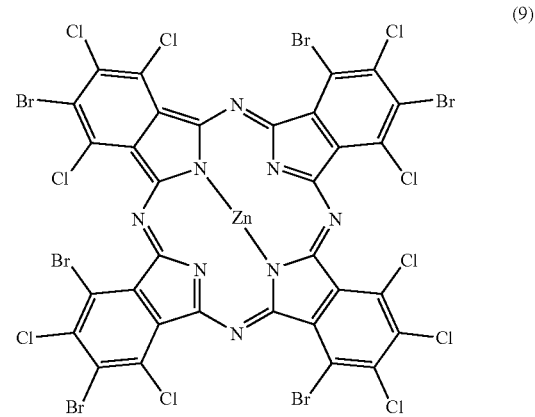

-continued

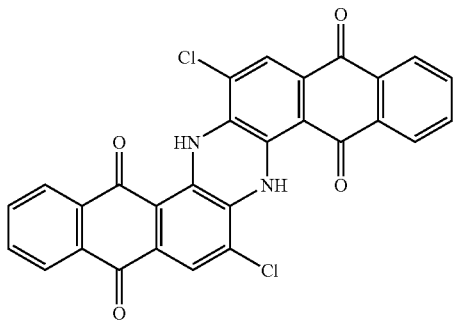
(10)

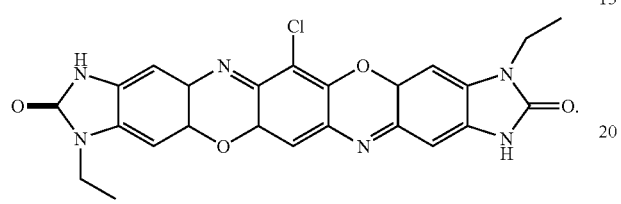
(11)

12. An image sensor comprising a color filter produced using a photosensitive resin composition comprising an alkali-soluble resin, a photopolymerizable monomer, a photopolymerization initiator, 6.2 to about 40% by weight of a pigment and about 0.1 to about 20% by weight of a dye as colorants, and a solvent, wherein the dye includes at least one compound selected from compounds represented by Formulae 1, 2, and 3:

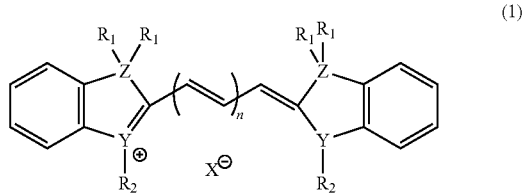
(1)

wherein each $R_1$ is independently H or $CH_3$, each $R_2$ is independently a C1-C10 alkyl group, each Y is independently N, O or S, each Z is independently N, O, S or C, n is from 1 to 3, and X is a halogen, $ClO_4$, $PF_6$, $SbF_6$, $BF_4$ or

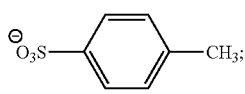

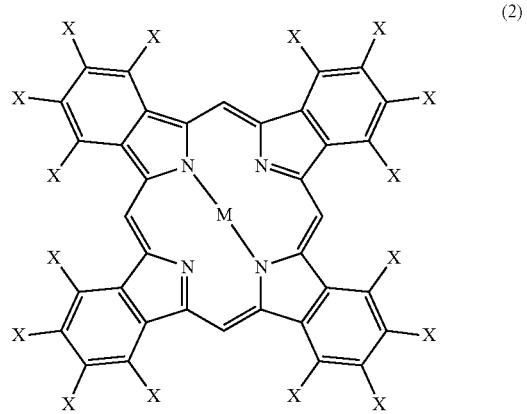
(2)

wherein M is Cu, Zn, V=O, Fe, Ni, Co, In—Cl, In-alkyl or In-alkoxy, and each X is independently H, F, Cl, Br or I; and

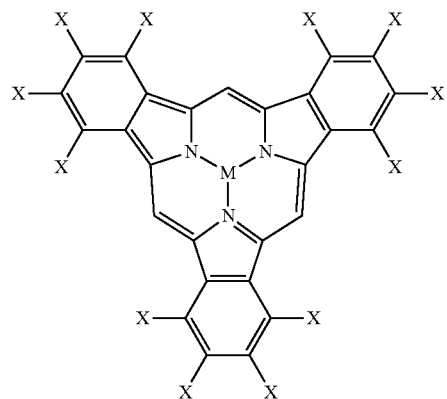
(3)

wherein M and X are as defined in Formula 2.

13. The image sensor according to claim 12, wherein the pigment is selected from compounds represented by Formulae 9, 10 and 11:

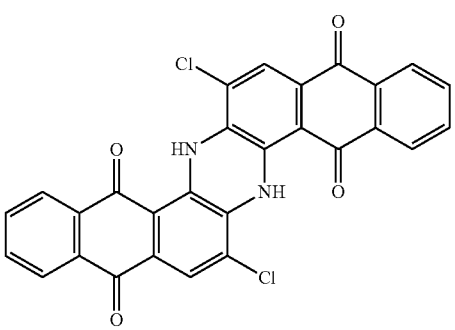
(9)

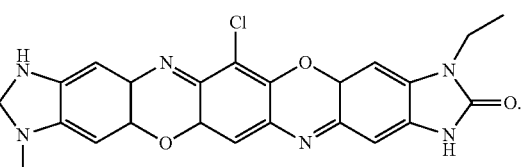
(10)

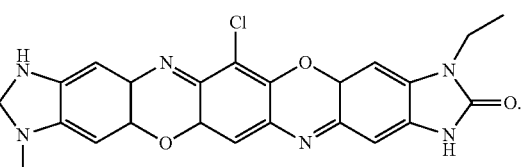
(11)

14. The photosensitive resin composition according to claim 1, wherein the composition comprises 9 to about 40% by weight of the pigment.

15. The photosensitive resin composition according to claim 1, wherein the composition comprises the pigment an amount greater than the dye.

16. The color filter according to claim 8, wherein the composition comprises 9 to about 40% by weight of the pigment.

17. The color filter according to claim 8, wherein the composition comprises the pigment an amount greater than the dye.

18. The coated substrate according to claim 10, wherein the composition comprises 9 to about 40% by weight of the pigment.

19. The coated substrate according to claim 10, wherein the composition comprises the pigment an amount greater than the dye.

20. The image sensor according to claim 12, wherein the composition comprises 9 to about 40% by weight of the pigment.

* * * * *

UNITED STATES PATENT AND TRADEMARK OFFICE
CERTIFICATE OF CORRECTION

PATENT NO. : 8,735,025 B2
APPLICATION NO. : 11/965134
DATED : May 27, 2014
INVENTOR(S) : Jae Hyun Kim et al.

It is certified that error appears in the above-identified patent and that said Letters Patent is hereby corrected as shown below:

In the Specification

Column 13, Line 23 reads: "EXamples 1 to 10 show excellent characteristics in terms of" and should read: "in Examples 1 to 10 show excellent characteristics in terms of"

In the Claims

Claim 1, Column 14, Lines 50-65 depict Formula 2

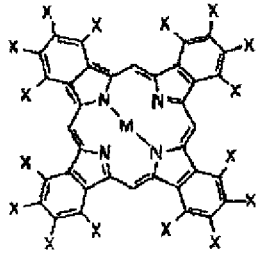

and should depict Formula 3

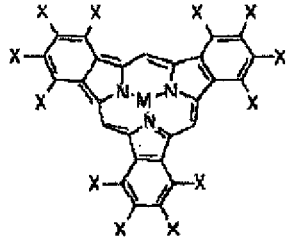

Signed and Sealed this
Fourth Day of November, 2014

Michelle K. Lee
*Deputy Director of the United States Patent and Trademark Office*